United States Patent

Taylor et al.

[11] Patent Number: 5,882,424
[45] Date of Patent: Mar. 16, 1999

[54] PLASMA CLEANING OF A CVD OR ETCH REACTOR USING A LOW OR MIXED FREQUENCY EXCITATION FIELD

[75] Inventors: Brad Taylor, Forest Grove, Oreg.; Turgut Sahin, Cupertino, Calif.; Charles Dornfest; Fritz Redeker, both of Fremont, Calif.

[73] Assignee: Applied Materials, Inc., Santa Clara, Calif.

[21] Appl. No.: 786,604

[22] Filed: Jan. 21, 1997

[51] Int. Cl.$^6$ .............................. B08B 7/00; B08B 9/00; B08B 5/00

[52] U.S. Cl. .............................. 134/1.1; 134/1; 134/22.1; 216/67

[58] Field of Search .................................. 134/1.1–22.1; 216/67

[56] References Cited

U.S. PATENT DOCUMENTS

| | | | |
|---|---|---|---|
| 4,464,223 | 8/1984 | Gorin ....................................... | 156/643 |
| 4,579,618 | 4/1986 | Celestino et al. ....................... | 156/345 |
| 4,786,352 | 11/1988 | Benzing ................................. | 156/345 |
| 5,421,957 | 6/1995 | Carlson et al. ......................... | 216/58 |
| 5,454,903 | 10/1995 | Redeker et al. ......................... | 216/67 |

FOREIGN PATENT DOCUMENTS

WO86/06687  11/1986  WIPO ..................... 134/1.1

*Primary Examiner*—Zeinab El-Arini
*Attorney, Agent, or Firm*—Michaelson & Wallace

[57] ABSTRACT

An apparatus and method for cleaning the interior of a vacuum chamber of a plasma reactor which includes introducing an etchant gas through inlet ports into the vacuum chamber and applying RF power to a RF plasma excitation apparatus so as to ignite and sustain a plasma within the chamber. The frequency of the RF signal is less than 1 MHz. Alternately, an apparatus and method for cleaning the aforementioned vacuum chamber where at least two different RF power signals can be employed. In one embodiment of this alternate method the step of applying RF power involves providing a first and second RF signal, where each signal exhibits a different frequency. The first RF signal is of a higher frequency and provided to ignite a plasma within the chamber, and thereafter terminated, whereas the second RF signal is of a lower frequency, less than 1 MHz, and provided to sustain the plasma. In another embodiment, the step of applying RF power again comprises providing separate RF signals, where each signal exhibits a different frequency. However, in this embodiment, the signals are used to generate a mixed frequency RF excitation field from the RF plasma excitation apparatus to ignite and sustain a plasma within the chamber. Here again, the first RF signal is of a higher frequency and the second RF signal is of a lower frequency, i.e. less than 1 MHz.

30 Claims, 3 Drawing Sheets

PLASMA CLEANING OF A CVD OR ETCH REACTOR USING A LOW OR MIXED FREQUENCY EXCITATION FIELD

BACKGROUND OF THE INVENTION

1. Technical Field

The invention relates to devices and methods for cleaning the interior surfaces of either a chemical vapor deposition (CVD) reactor or etch reactor using a plasma etch process to remove unwanted depositions.

2. Background Art

Reactors can perform various semiconductor processes on semiconductor substrates (often referred to as wafers), including dielectric etching and chemical vapor deposition (CVD). A reactor can employ purely chemical processes to perform CVD or etching, or else (depending upon the type of reactor), can perform radio frequency (RF) plasma CVD or plasma etching. The present description does not concern the process employed to carry out etching or CVD on a wafer but rather concerns a process for cleaning the interior surfaces of the reactor. Typically, during processing, unwanted depositions form on the interior surfaces of the reactor's vacuum chamber. For example, in a reactor used to perform chemical vapor deposition of silicon dioxide films, silicon dioxide ($SiO_2$) residue forms over the interior surfaces of the chamber. In RF plasma CVD reactors having RF electrodes inside the chamber, the electrodes themselves can become contaminated with silicon dioxide. Other materials can contaminate the chamber interior surfaces, depending upon the type of process performed by the reactor. For instance, silicon carbide (SiC), silicon nitride ($Si_3N_4$), and various silicon oxynitride ($Si_xO_yN_z$) deposits are also possibilities.

Unwanted depositions such as those described above, if allowed to build up on the interior surfaces of the reactor chamber, can inhibit the performance of the reactor. For example, in a CVD reactor, such unwanted depositions change the deposition rate from one wafer to the next, reduce the deposition uniformity across the surface of a given substrate, and change the layer stresses so that a consistent stress level cannot be maintained between successive thin film layers. In addition, these depositions could eventually flake off as conditions within the reactor chamber change during processing, thereby forming particulates. These particles may fall onto the wafer being processed, thereby damaging devices formed thereon and reducing the yield.

Preferably, the foregoing difficulties are generally avoided by cleaning the reactor chamber interior shortly before inserting a wafer to be processed into the chamber. In a reactor equipped with RF plasma excitation electrodes and/or an RF plasma excitation antenna, silicon dioxide deposits are typically cleaned by the introduction of an etchant gas, such as ethyl hexafluoride ($C_2F_6$), into the chamber. The etchant gas is ignited into a plasma by the RF excitation apparatus of the reactor. For high-rate CVD RF plasma reactors, an RF excitation field of 13.56 MHz is typically employed to ignite the plasma and is used during both wafer processing and chamber clean operations. In fact, a 13.56 MHz RF field with $C_2F_6$ etchant gas is the most often used combination in performing RF plasma cleaning operations involving silicon dioxide deposits. The $C_2F_6$ gas, when ignited as a plasma, produces a radical $CF_3$ in the following reaction:

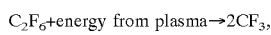

$C_2F_6$+energy from plasma→$2CF_3$, the $CF_3$ providing the fluorine reactant species for etching of silicon dioxide deposits.

In the case of silicon nitride or silicon oxynitride deposits, the cleaning operation is typically performed using carbon tetrafluoride ($CF_4$) or carbon hexafluoroethane and the like, along with an oxygen source such as oxygen or nitrous oxide and the like.

One problem with current cleaning processes is that the unwanted deposits on the interior chamber surfaces typically vary in thickness from one location to the next. Therefore, it is difficult to remove the unwanted deposit uniformly. Some of the interior chamber surfaces will still have remaining deposits, when others have been completely cleaned. One solution to this problem would be to perform the cleaning process for a long enough period of time to ensure all the deposits are removed. However, this would further reduce the productive cycle of the reactor, forcing it to spend more time in the unproductive cleaning process rather than in processing wafers. In addition, prolonged plasma cleaning operations can result in significant damage to cleaned chamber surfaces. The extra time required to ensure that all the chamber surfaces are thoroughly cleaned can cause varying degrees of damage to the first-cleaned surfaces.

Another problem with the use of $C_2F_6$, and related etchant gases such as $CF_4$, is that they are so-called "greenhouse" gases. The U.S. Environmental Protection Agency has ordered the reduction of all such gases which contribute to the depletion of the ozone layer and support the greenhouse effect. This means limiting or curtailing the use of the most widely employed etchant gases for reactor chamber cleaning.

Of course, other "non-greenhouse" gases are available to perform the aforementioned cleaning operation. For example, nitrogen-fluorine based etchant gases, such as $NF_3$, provide one alternative. $NF_3$ is a very aggressive etchant gas because it produces more fluorine in the plasma than the aforementioned "greenhouse" gases. Therefore, the interior surfaces of the reactor chamber are cleaned much faster. However, there are drawbacks to using $NF_3$. One characteristic property of $NF_3$ is that it is strongly electronegative (more so than $CF_4$ or $C_2F_6$) and therefore tends to reduce the population of free electrons in the plasma, due to its great affinity for electrons. The problem is that at RF excitation frequencies in the megahertz range (such as, for example, 13.56 MHz), a depleted electron population causes insufficient coupling between the RF signal and the plasma to sustain the plasma. This is primarily because at such high frequencies, the electrons are the only charged particles in the plasma with sufficient charge-to-mass ratio to be able to follow the rapid RF field oscillations. Thus, it is the electrons which kinetically couple the energy from the RF field to the ions and radicals in the plasma. The result is that as $NF_3$ begins to reduce the electron population in the plasma, portions of the plasma become unstable, and flickering or collapsing of the plasma may be observed. Such plasma instability occurs at temperatures below 1000 degrees C and at chamber pressures between 0.005 and 10 Torr and at RF excitation frequencies on the order of 13.56 MHz. However, these are the very parameters preferred for current plasma cleaning operations. Plasma instabilities make the cleaning process uncertain, since plasma flickering results in the plasma density being reduced in various regions of the chamber for varying durations. This makes cleaning process control problematic, and the chamber may not be entirely cleaned at the conclusion of a given chamber cleaning process. With such instabilities, the effective plasma "on" time throughout the chamber is uncertain and so it is not possible to predict the required clean time with reasonable accuracy for consistent repetitive chamber clean operations. As a result, the specified chamber clean time is typically increased above that which would normally be necessary if the plasma was stable. This increased cleaning time can result in the damage to the first-cleaned chamber surfaces, as discussed previously, as well as increased processing downtime. And finally, it is noted that $NF_3$ is a relatively expensive gas, as compared to other etchant species which are employed in plasma cleaning operations, thus making its use costly.

Another example of a "non-greenhouse" gas that could be employed for chamber cleaning is sulfur hexafluoride ($SF_6$). However, when this etchant gas is used at the typical pressures and excitation frequencies, it exhibits an extremely poor cleaning performance. Due to this inefficiency, large quantities of the gas are required, along with long cleaning times. Thus, the expense of using this gas is high and wafer throughput is low.

As is evident from the above discussion, devices and methods for cleaning the interior surfaces of a plasma CVD or etch reactor are needed which will reduce or eliminate the need to employ "greenhouse gases", and alleviate the problems associated with the aforementioned alternate etchant gases. In addition, it is desired to reduce the cleaning times, without sacrificing the thoroughness of the cleaning, so as to improve the throughput of the plasma reactor.

SUMMARY OF THE INVENTION

The stated objectives are realized by an apparatus and method for cleaning the interior of a vacuum chamber of a RF plasma reactor which includes introducing an etchant gas through inlets into the vacuum chamber and applying RF power via a RF signal to a RF plasma excitation apparatus so as to ignite and sustain a plasma within the chamber. The frequency of the RF signal is made such that a substantial portion of the etchant gas molecules are influenced by and follow the RF field oscillation created within the chamber by the RF plasma excitation apparatus. This frequency is less than 1 MHz, and preferably within a range of about 50 kHz to about 800 kHz.

The stated objective is also realized by an apparatus and method for cleaning the aforementioned vacuum chamber where at least two different RF power signals are employed. In one embodiment of this version of the method the step of applying RF power involves providing a first and second RF signal, where each signal exhibits a different frequency. The first RF signal is of a higher frequency and provided to ignite a plasma within the chamber, and thereafter terminated, whereas the second RF signal is of a lower frequency and provided to sustain the plasma. This lower frequency is again less than 1 MHz, and preferably within a range of about 50 kHz to about 800 kHz. In another embodiment, the step of applying RF power again comprises providing separate RF signals, where each signal exhibits a different frequency. However, in this embodiment, the signals are used to generate a mixed frequency RF excitation field from the RF plasma excitation apparatus to ignite and sustain a plasma within the chamber. The first signal exhibits a higher frequency preferably within a range of about 1 MHz to about 15 MHz, and the second RF signal exhibits a lower frequency in the previously stated ranges.

These devices and methods reduce the need to employ "greenhouse" gases, such as $C_2F_6$, by increasing the cleaning efficiency of the etchant gas. This improved efficiency makes it possible to use less of the gas. In this way, the mandated reduction in the usage of "greenhouse" gases is accomplished. In addition, the devices and methods can be used to increase the cleaning efficiency of other "non-greenhouse" gases. Accordingly, etchant gases which were heretofore too expensive or too inefficient become viable alternatives to the widely used "greenhouse" gases. The aforementioned devices and methods also solve other problems traditionally associated with using the "non-greenhouse" etchant gases. For example, as discussed above the lower frequency excitation results in a substantial portion of the etchant gas molecules being influenced by and following the RF field oscillations. This means the coupling of power to the plasma is not dependent solely on the electrons, but rather involves other plasma particles as well. Thus, highly electronegative gases such as $NF_3$ which deplete the electron population of the plasma can be employed without the resulting plasma instabilities.

Additionally, it has been found that the increase in the cleaning efficiency of the aforementioned etchant gases can result in a decreased cleaning time. In this way, the reactor throughput is advantageously increased.

DETAILED DESCRIPTION OF THE PREFERRED EMBODIMENTS

In the following description of the preferred embodiments of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

Figure 1:
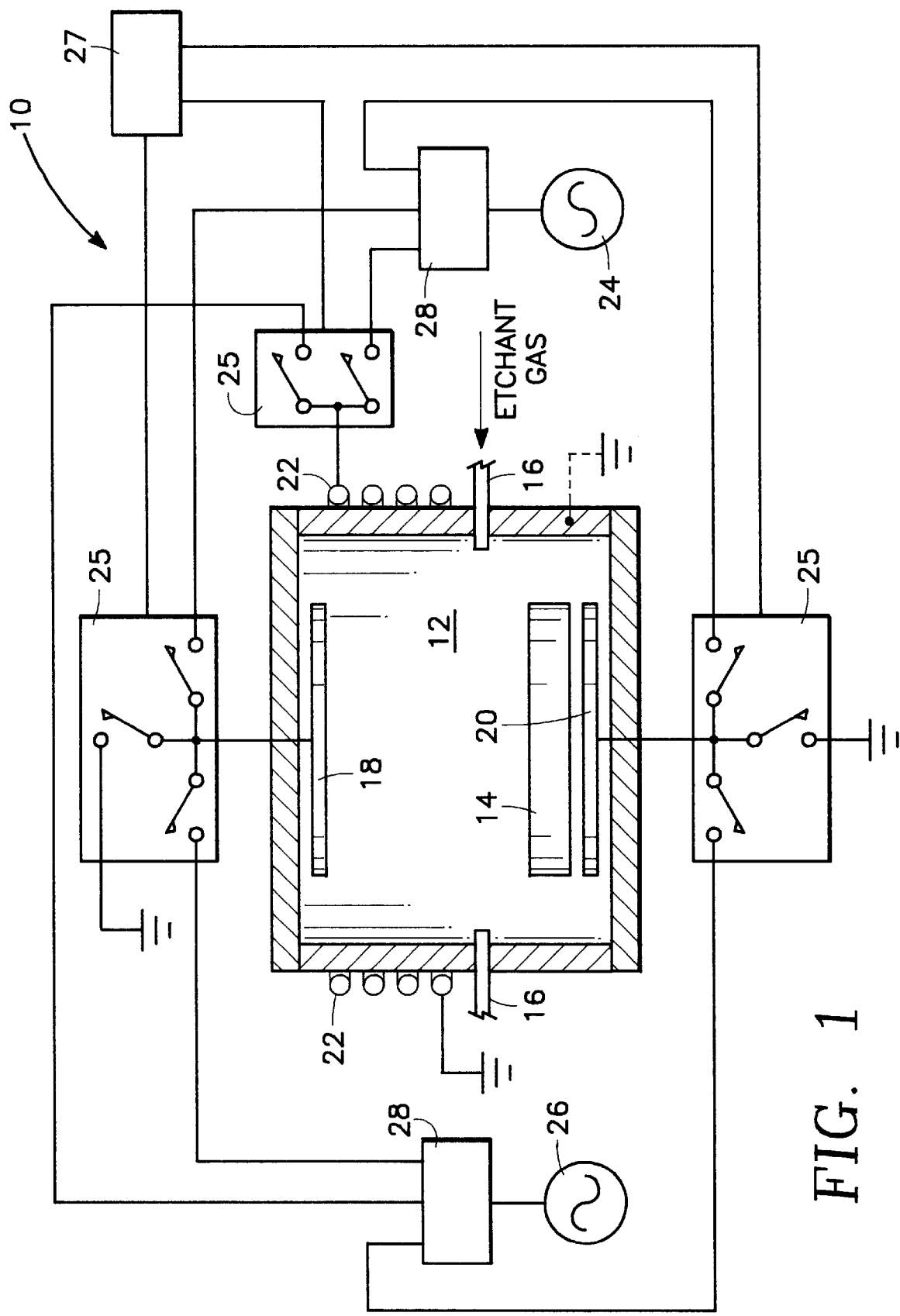
FIG. 1 is an exemplary, partially cross-sectional diagram of a type of RF plasma reactor in which the invention can be embodied.

The preferred embodiments of the present invention solve the previously described problems by employing a lower frequency RF excitation field, alone or in combination with a high frequency RF field, during chamber cleaning operations. Referring to FIG. 1, a reactor 10 capable of performing this task is shown. The reactor 10, which can be used for either chemical etching or chemical CVD or plasma etching or plasma CVD, includes a vacuum chamber 12, a substrate support 14 for holding a semiconductor substrate to be processed (but typically not during chamber cleaning operations), and gas inlet ports 16. In addition, the reactor includes RF excitation apparatus such as electrodes 18, 20 and/or an RF antenna 22, as well as a high frequency RF source 24 and a low frequency RF source 26, each of which is capable of being connected to either or both of the electrodes 18, 20, and/or the RF antenna 22. Finally, the RF excitation apparatus includes three conventional processor controlled switching devices 25, or the like, which are capable of connecting the high frequency RF power source 24 and/or the low frequency RF power source 26 to one or both of the electrodes 18, 20 and/or the RF antenna 22. The also capable of connecting also capable of connecting either of the electrodes 18, 20 to ground. A process controller 27, such as a microprocessor, is used to control the switching devices 25. This controller 27 is also preferably configured to control others or all of the plasma reactor components. This allows the controller 27 to control such reactor processing parameters as pressure, temperature, gas flow, and the like.

It is noted that the RF excitation apparatus shown in FIG. 1 is meant to be exemplary in nature. The placement of the electrodes 18, 20, and the antenna 22, can be varied. Additionally, even though both electrodes 18, 20 and an antenna 22 are shown, any may be omitted.

In one embodiment, a chamber cleaning operation is conducted with the RF excitation electrodes 18, 20 and/or RF antenna 22 being driven at a low frequency below about 1 MHz using the low frequency RF source 26. Preferably, the frequency is between about 50–800 kHz. The lower frequency excitation has significant advantages when performing chamber cleaning operations. First, the etchant gas molecules spend more time in the excitation field resulting in more collisions, and therefore, a higher degree of dissociation of the etchant gas. It is believed a dissociation of approximately 40–70 percent can be achieved, as compared to a maximum of about 30 percent typical of current high frequency excitation cleaning operations. An increased dissociation means that more reactant species are available to clean the unwanted deposits from the chamber surfaces. If more of the reactant species are available, less of the etchant gas is needed to perform the same degree of cleaning in comparison to the high frequency cleaning procedures. Accordingly, if one of the "greenhouse" gases, such as $C_2F_6$, is being used to clean the interior surfaces of the reactor chamber, less of this gas will be necessary and the mandated reduction is accomplished. In addition, the need for a "greenhouse" gas could be substantially or completely eliminated because a higher degree of dissociation would make the alternate etchant gases more viable as a supplement or replacement for the "greenhouse" gases. For example, in the case of an expensive etchant gas, such as $NF_3$, less would be required to thoroughly clean the chamber. The cost of using this gas is thereby reduced, and its use becomes more attractive. In addition, the increased dissociation can speed the cleaning process, thereby reducing the amount of time required to completely clean the chamber surfaces. Thus, reactor throughput time is improved.

Similar benefits are realized in the case of an inefficient etchant gas, such as $SF_6$, where a higher degree of dissociation boosts its cleaning efficiency. This higher efficiency allows less of the gas to be employed, thereby reducing the cost and possibly decreasing the time required to complete the chamber cleaning process.

Another benefit of a lower frequency excitation is that the power provided to the RF excitation apparatus can be reduced. In current high frequency cleaning systems, the RF power is kept high (i.e. as high as about 2000 watts in some applications). The high power is used to, in part, increase the dissociation of the etchant gas, and in part, to provide energetic plasma particles. In principal, the greater dissociation increases the ion-assisted etching action and the momentum of the energetic particles contributes to the removal of the unwanted deposits via physical impact (i.e. sputtering). In this way the time required to clean the chamber is minimized. However, as discussed previously, residue is cleaned from some surfaces of the chamber before others. The first-cleaned surfaces can be significantly damaged by the physical impact of the energetic plasma particles. Thus, there is a tradeoff between the cleaning rate and the degree of damage to the first-cleaned surfaces in current high frequency cleaning systems. If the power is decreased, the plasma particles would be less energetic and so do less damage to the cleaned surfaces. However, the particles' contribution to residue removal via physical impact and the degree of dissociation of the etchant gas also falls. Thus, the cleaning rate decreases. If the power is increased, the cleaning rate increases, but so does the damage to the first-cleaned surfaces.

Figure 2:
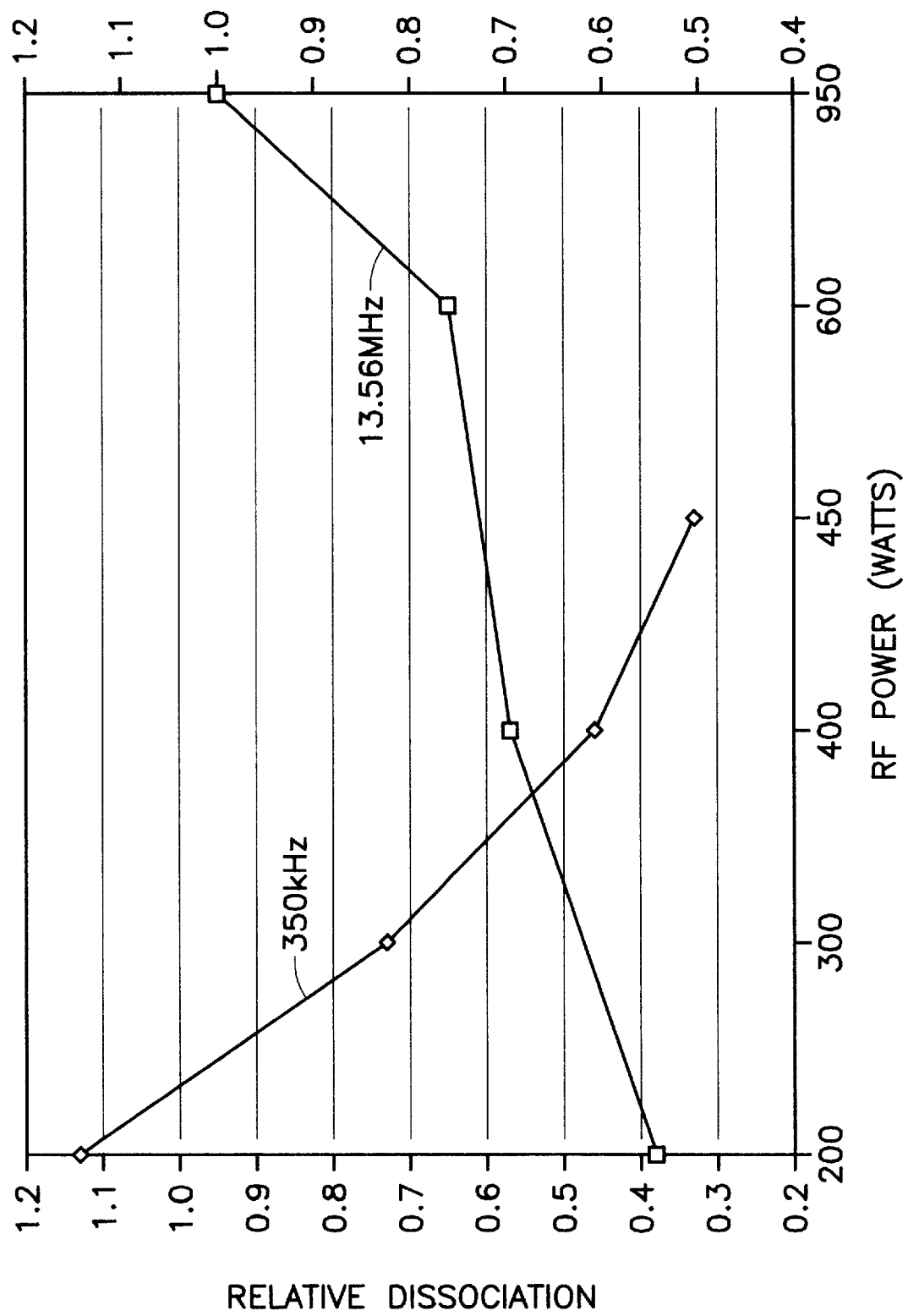
FIG. 2 is graph plotting relative dissociation of etchant gases against RF power at both 350 kHz and 13.56 MHz in a fluorine-based plasma.

The embodiments of the present invention, on the other hand, provide a way to reduce the physical damage to the cleaned surfaces by employing lower power levels, while at the same time increasing the efficiency and utilization of the etchant gas. The graph depicted in FIG. 2 shows that with low frequency excitation, the relative dissociation of the etchant gas is greater at lower power levels, and decreases as the power increases. Since the lower frequency excitation of the plasma tends to increase the dissociation of the etchant gas, as explained above, higher power is not needed for this purpose. It has been found that a RF power range of about 100–500 watts is feasible using a low frequency excitation field. Thus, the plasma particles are not as energetic and so do less damage. In addition, the aforementioned higher frequency of collisions resulting from the use of a lower frequency excitation of the plasma also reduces the overall energy and momentum of the plasma particles. Further, the higher frequency of collisions creates a larger plasma current. The plasma current tends to counteract any bias potential between the electrodes 18, 20 of FIG. 1 (if used). This, in turn, reduces the acceleration of the plasma particles caused by the bias, and so reduces the damage to chamber surfaces, especially the electrodes.

The exact power level employed is preferably chosen so as to maximize the dissociation of the etchant gas. Maximizing the dissociation minimizes cleaning time and etchant gas requirements, as discussed previously. The power level which will maximize the dissociation of the etchant gas will vary depending on the type of etchant gas employed and the exact frequency chosen for the low frequency excitation signal. However, the optimum power level which will maximize dissociation for a particular etchant gas and frequency can be readily determine using conventional testing methods. For example, it has been found that when $C_2F_6$ is employed as an etchant gas at an excitation frequency of 350 kHz, a maximum dissociation of the gas is obtained at approximately 200 watts.

The net result of the increased dissociation of the etchant gas and decrease in particle momentum in the plasma afforded by the low frequency excitation field is to maximize the etching action of the plasma while minimizing any damage to the chamber structures, particularly on the electrode surfaces. It is believed that in most cases, the increase in etchant gas dissociation will compensate for any decrease in the rate of removal of the unwanted deposits due to the decrease in particle momentum. However, even if under some circumstances the overall cleaning rate is lowered, this is balanced against the benefit of reducing or eliminating the need for the aforementioned "greenhouse" gases.

The lower frequency excitation also allows plasma particles (i.e. ions and radicals) other than just electrons to follow the RF excitation field oscillations, thereby lessening the role of the electrons in kinetically coupling the RF energy to the plasma. As a result, a strongly electronegative etchant gas, such as $NF_3$, can be employed with a reduced occurrence of the previously described plasma instabilities. This makes the use of $NF_3$ even more attractive as a replacement or supplement for a "greenhouse gas" etchant species.

Although the low frequency excitation has advantages in a plasma cleaning operation, its use in combination with a high frequency excitation may provide additional advantages not available when low frequency is used alone. For example, a high frequency excitation field can provide more efficient method of igniting the plasma. This high frequency would be in the MHz range, and preferably between about 1–15 MHz. Referring to FIG. 1, initially, the high frequency RF source 24 would be connected to one or both of the electrodes 18, 20 and/or the antenna 22 until the plasma has been generated. Thereafter, the high frequency source 24 would be disconnected, and the low frequency RF source 26 would be connected to one or both of the electrodes 18, 20 and/or the antenna 22 to sustain the plasma during the cleaning operation.

The high frequency source 24 could also be left on to provide a mixed frequency excitation of the plasma. It is believed that a mixed frequency excitation during cleaning operations may provide a better cleaning of some areas of the chamber. Examples are some of the peripheral chamber components exclusive of the electrodes 18, 20, such as the chamber walls, pumping manifolds and pumping channels. In addition, it is believed that some types of deposits would be etched more efficiently in the presence of a mixed frequency excitation. For example, the mixed frequency excitation may more efficiently etch thermally deposited films which tend to deposit globally within the vacuum chamber 12 (as compared to a plasma deposited film which tends to have a deposition pattern more confined to the area between the driven electrodes 18, 20). These advantages associated with the use of a mixed frequency excitation of the plasma during cleaning operation may result from an expansion of the plasma within the reactor chamber which brings it closer to the peripheral chamber components.

The mixed frequency excitation can be accomplished in a number of ways. One or both of the electrodes 18, 20 and/or the antenna 22, could be driven simultaneously by the high frequency and low frequency RF power sources 24, 26. Alternately, one or both of the electrodes could be driven by one of the two sources 24, 26 and the antenna 22 could be driven by the other source. Or, one of the electrodes 18, 20 could be driven by one of the two sources 24, 26, while the other electrode is driven by the other source, as long as the chamber is grounded (as shown in the dashed lines of FIG. 1). Of course, these are just examples of the possible permutations for driving the electrodes 18, 20, and antenna 22. It is not intended the present invention be limited to just these scenarios. Additionally, a single power supply might be employed which is capable of generating multiple RF signals of differing frequency. The key point is that a mixed frequency excitation is produced by simultaneously coupling high and low frequency RF signals to the plasma, no matter what driving configuration is employed. It is also noted that to prevent reflected power from affecting the performance of the RF power sources 24, 26, it is preferred that appropriate tunable matching networks 28 be employed between the sources 24, 26, and the electrodes 18, 20 and antenna 22. In addition, in those cases where both high and low frequency power sources are coupled to the same electrode or the antenna, it is preferred that the appropriate filter network (not shown) be employed to attenuate undesirable frequencies produced by the mixing of the high and low frequencies and to isolate the power sources from each other. As these matching and filtering networks are well known in the art, no detailed description is provided herein.

As with an exclusively low frequency cleaning operation, the power levels associated with a mixed frequency chamber cleaning process are preferably optimized so as to maximize the dissociation of the etchant gas. The optimum power levels for the low frequency excitation signal and the high frequency excitation signal which will maximize the degree of dissociation depend on the type of etchant gas involved and exact frequencies employed for the two excitation signals. Here again, the optimum power levels which will maximize dissociation for a particular etchant gas and the chosen excitation signal frequencies can be readily determined using conventional testing methods.

The following example involving the cleaning of silicon nitride deposits from the interior surfaces of a particular type of plasma reactor is provided to further illustrate the practice of the invention. It is not intended that the invention be limited to the devices and methods described in this example, or to the cleaning of only silicon nitride deposits.

Figure 3:
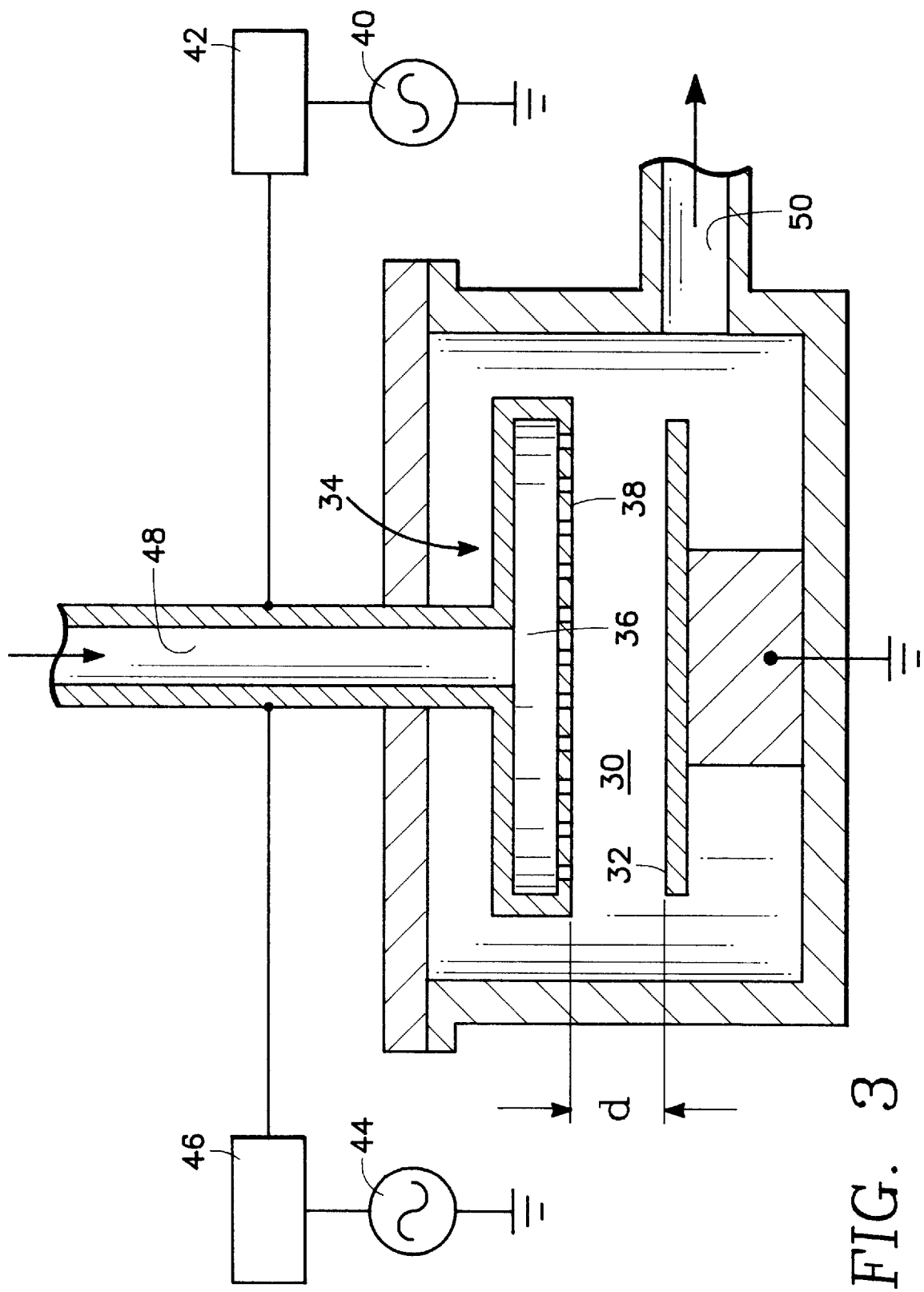
FIG. 3 is an exemplary, partially cross-sectional diagram of a parallel plate, plasma enhanced CVD reactor in which the invention can be embodied.

Although many different types of plasma reactors can be used to deposit silicon nitride films, so-called parallel plate plasma reactors are widely used. FIG. 3 illustrates a simplified CVD plasma reactor having such a parallel plate architecture. This reactor includes a processing chamber 30 having a substrate support 32 which is parallel to and separated by a distance "d" from a gas inlet manifold 34. The gas inlet manifold 34 includes a chamber 36 in which the plasma gases are mixed and a gas manifold plate 38 having a plurality of small openings through which the plasma precursor gases pass into the plasma region between the gas manifold plate 38 and the substrate support 32. The substrate support 32 corresponds to one of the parallel plates and the gas manifold plate 38 corresponds to the other of the parallel plates. The gas manifold plate 38 is connected to a high frequency source 40, through an impedance matching network 42. A low frequency power source 44 is also connected to the gas manifold plate 38 through an impedance matching network 46. A plasma precursor gas is passed via an inlet pipe 48 through the gas manifold plate 38. The chamber 30 is evacuated by means of an exhaust pump (not shown) through outlet 50, so as to control the pressure in the chamber (generally at 1–10 Torr). In this example, the high frequency power source 40 has a RF frequency of about 13.56 MHz, whereas the low frequency power source 44 has a frequency generally about 200–600 kHz. In addition, the low frequency power source 44 generates about 90–500 watts, and the high frequency power source 40 is set so that the total excitation power remains between about 200–1000 watts.

It has been found that plasma cleaning of a plasma enhanced CVD reactor chamber, such as depicted in FIG. 3, can be carried out in a shorter period of time and more thoroughly when both a high frequency power source 40 and a low frequency power source 44 are employed during the cleaning process. For example, it has been found that during a normal cleaning cycle, the last place in the chamber to be cleared of silicon nitride deposits is the gas manifold plate 38. Since this plate 38 is adjacent to the plasma during processing, any particles that flake off are carried by the plasma onto the substrate. Thus, a thorough cleaning of the gas manifold plate 38 is particularly important. The above-described dual mixed frequency excitation of the gas manifold plate resulted in a reduced cleaning time to completely remove silicon nitride from all surfaces in the plasma CVD reactor, including the periphery of the gas manifold plate. Specifically, the heretofore typical cleaning time of 120 seconds was reduced to between about 30–40 seconds.

Additionally, the thickness of the silicon nitride deposits is not usually uniform across the gas manifold plate 38. It is typically thicker near the periphery of the plate 38. It is believed the theorized expansion of the plasma within the chamber under a dual, mixed frequency excitation scheme advantageously increases the rate at which the peripheral, thicker deposits are removed. Thus, the dual, mixed frequency excitation also contributes to a more thorough cleaning of the chamber surfaces.

While the invention has been described in detail by specific reference to preferred embodiments, it is understood that variations and modifications thereof may be made without departing from the true spirit and scope of the invention. For example, more than two RF power sources could be employed to drive the RF excitation apparatus to generate the previously described mixed excitation field.

What is claimed is:

1. A method for cleaning unwanted deposition from the interior surface of a vacuum chamber of a plasma reactor, the reactor having RF plasma excitation apparatus and gas inlet ports, the method comprising the steps of:

introducing an etchant gas through the inlet ports into the vacuum chamber; and applying RF power via a RF signal to the RF plasma excitation apparatus so as to ignite and sustain a plasma within the chamber during cleaning; wherein the RF signal has a frequency which is less than 1 MHz.

2. The method of claim 1 wherein the frequency of said RF power is within a range of about 50 kHz to about 800 kHz.

3. The method of claim 1 wherein the step of applying RF power comprises selecting an RF power level which produces an approximately maximum dissociation of the etchant gas in the plasma.

4. The method of claim 3 wherein the RF power level is within a range from about 100 watts to about 500 watts.

5. The method of claim 1 wherein said etchant gas comprises a fluorine compound.

6. The method of claim 5 wherein said etchant gas comprises a carbon-fluorine compound.

7. The method of claim 6 wherein the step of introducing the etchant gas comprises the step of minimizing the amount of the carbon-fluorine compound introduced to an amount just sufficient enough to effect a thorough cleaning deposited residue from the interior surfaces of the chamber.

8. The method of claim 5 wherein the fluorine compound comprises a nitrogen-fluorine compound.

9. The method of claim 8 wherein said nitrogen-fluorine compound comprises $NF_3$.

10. The method of claim 5 wherein the fluorine compound comprises a sulfur-fluorine compound.

11. The method of claim 10, wherein said sulfur-fluorine compound comprises $SF_6$.

12. The method of claim 1 wherein the etchant gas comprises a combination of fluorine compounds.

13. The method of claim 12 wherein the step of introducing the etchant gas comprises one of: (i) minimizing the amount of carbon-fluorine compounds in said combination of fluorine compounds, or (ii) foregoing the use of carbon-fluorine compounds in said combination of fluorine compounds.

14. The method of claim 12 wherein the combination of fluorine compounds comprises a nitrogen-fluorine compound.

15. The method of claim 14 wherein said nitrogen-fluorine compound comprises $NF_3$.

16. The method of claim 12 wherein the combination of fluorine compounds comprises a sulfur-fluorine compound.

17. The method of claim 16 wherein said sulfur-fluorine compound comprises $SF_6$.

18. The method of claim 1 wherein the RF plasma excitation apparatus comprises at least one of (i) a pair of electrodes, and (ii) a RF antenna, and wherein the step of applying the RF power comprises:

providing the RF signal to at least one of (i) a first one of the pair of electrodes, (ii) a second one of the pair of electrodes, and (iii) the RF antenna.

19. A method for cleaning unwanted deposition from the interior surface of a vacuum chamber of a plasma reactor, the reactor having RF plasma excitation apparatus and gas inlet ports, the method comprising the steps of:

introducing an etchant gas through the inlet ports into the vacuum chamber; and applying RF power to the RF plasma excitation apparatus; wherein said step of applying RF power comprises providing separate RF signals, each signal exhibiting a different frequency, the combination of which causes a mixed frequency RF excitation field to be generated by the RF plasma excitation apparatus for igniting and sustaining a plasma within the chamber during cleaning.

20. The method of claim 19 wherein the step of applying the RF power comprises:

providing a first RF signal exhibiting a higher frequency and a second RF signal exhibiting a lower frequency, said lower frequency being less than 1 MHz.

21. The method of claim 20 wherein the higher frequency is within a range of about 1 MHz to about 15 MHz, and the lower frequency is within a range of about 50 kHz to about 800 kHz.

22. The method of claim 20 wherein the step of providing a first RF signal exhibiting a higher frequency and a second RF signal exhibiting a lower frequency comprises selecting an RF power level for each signal which in combination produces an approximately maximum dissociation of the etchant gas in the plasma.

23. The method of claim 20 wherein the RF plasma excitation apparatus comprises at least one of (i) a pair of electrodes, and (ii) a RF antenna, and wherein the step of applying the RF power comprises:

providing the first and second RF signals to at least one of (i) a first one of the pair of electrodes, (ii) a second one of the pair of electrodes, and (iii) the RF antenna.

24. The method of claim 20 wherein the RF plasma excitation apparatus comprises a pair of electrodes, and the chamber is grounded, and wherein the step of applying the RF power comprises:

providing the first RF signal to a first one of the pair of electrodes and the second RF signal to a second one of the pair of electrodes.

25. The method of claim 20 wherein the RF plasma excitation apparatus comprises a pair of electrodes and a RF antenna, and wherein the step of applying the RF power comprises:

providing one of (i) the first RF signal to at least a one of the pair of electrodes and the second RF signal to the RF antenna, or (ii) providing the first RF signal to the RF antenna and the second RF signal to at least one of the pair of electrodes.

26. A method for cleaning unwanted deposition from the interior surface of a vacuum chamber of a plasma reactor, the reactor having RF plasma excitation apparatus and gas inlet ports, the method comprising the steps of:

introducing an etchant gas through the inlet ports into the vacuum chamber; and applying RF power to the RF plasma excitation apparatus during cleaning; wherein said step of applying RF power comprises providing a first and second RF signal, each signal exhibiting a different frequency, wherein the first RF signal is provided to ignite a plasma within the chamber and thereafter terminated, and the second RF signal is provided to sustain the plasma.

27. The method of claim 26 wherein the second RF signal exhibits a frequency which is less than 1 MHz.

28. The method of claim 26 wherein the first RF signal exhibits a higher frequency and the second RF signal exhibits a lower frequency, the lower frequency being within a range of about 50 kHz to about 800 kHz, and the higher frequency is within a range of about 1 MHz to about 15 MHz.

29. The method of claim 26 wherein the step of providing the second RF signal comprises selecting an RF power level of the second RF signal which produces an approximately maximum dissociation of the etchant gas in the plasma.

30. The method of claim 29 wherein the RF power level is within a range from about 100 watts to about 500 watts.

* * * * *